(12) United States Patent
Bollwerk et al.

(10) Patent No.: US 7,629,723 B2
(45) Date of Patent: Dec. 8, 2009

(54) DETECTION OF THE AMOUNT OF WEAR ON A MOTOR DRIVE SYSTEM

(75) Inventors: Andre Bollwerk, Freiberg A.N. (DE); Wolfgang Reeb, Ottersweier Hatzenweier (DE); Reiner Fellmeth, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 346 days.

(21) Appl. No.: 11/636,194

(22) Filed: Dec. 8, 2006

(65) Prior Publication Data
US 2007/0138899 A1      Jun. 21, 2007

(30) Foreign Application Priority Data
Dec. 16, 2005    (DE) .................. 10 2005 060 324

(51) Int. Cl.
*H01R 39/58* (2006.01)
*G08B 21/00* (2006.01)

(52) U.S. Cl. .................. 310/248; 310/242; 324/522; 340/648; 340/679

(58) Field of Classification Search .............. 310/248, 310/242; 340/648, 660–664, 679; 324/522, 324/772, 538
See application file for complete search history.

(56) References Cited

U.S. PATENT DOCUMENTS

| | | | | |
|---|---|---|---|---|
| 3,653,019 A | * | 3/1972 | Barton et al. .............. | 340/659 |
| 3,746,930 A | * | 7/1973 | Van Best et al. ........... | 361/86 |
| 4,024,525 A | * | 5/1977 | Baumgartner et al. ....... | 340/648 |
| 4,058,804 A | * | 11/1977 | Sawada et al. ............ | 340/635 |
| 4,163,227 A | * | 7/1979 | Sawada et al. ............ | 340/662 |
| 4,334,188 A | * | 6/1982 | Dudley ................. | 324/133 |
| 4,394,648 A | * | 7/1983 | Mattson ................ | 340/679 |
| 4,451,786 A | * | 5/1984 | Sawada et al. ............ | 324/772 |
| 4,528,556 A | * | 7/1985 | Maddox ................ | 340/648 |
| 4,542,374 A | * | 9/1985 | Kollmannsberger et al. . | 340/648 |
| 5,729,145 A | * | 3/1998 | Blades ................. | 324/536 |
| 6,507,797 B1 | * | 1/2003 | Kliman et al. ............ | 702/75 |
| 6,993,439 B2 | * | 1/2006 | Grosjean ............... | 702/66 |
| 7,161,493 B2 | * | 1/2007 | Itou et al. .............. | 340/648 |

FOREIGN PATENT DOCUMENTS

| | | |
|---|---|---|
| DE | 199 23 689 | 11/2000 |
| DE | 10 2004 035318 | 2/2006 |

\* cited by examiner

*Primary Examiner*—Burton Mullins
(74) *Attorney, Agent, or Firm*—Kenyon & Kenyon LLP

(57) ABSTRACT

A method and a device, respectively, for detecting the amount of wear on the carbon brush drive system of an electrically commutated d.c. motor which is used, for example, in the form of a pump motor in a motor vehicle. The d.c. motor is driven by at least two carbon brushes and includes means for detecting the generative follow-up voltage. The amount of wear on at least one carbon brush is derived from the time behavior of the generative motor voltage and displayed to the driver.

16 Claims, 4 Drawing Sheets

DETECTION OF THE AMOUNT OF WEAR ON A MOTOR DRIVE SYSTEM

FIELD OF THE INVENTION

The present invention is directed to a method and a device for detecting the amount of wear on the drive system (drive circuit) of an electric motor.

BACKGROUND INFORMATION

In the case of electrically commutated motors, in particular d.c. motors, electrochemical, electrical and/or mechanical processes may result in wear on the carbon brushes of the commutator. In extreme cases, this wear may cause the electrically commutated motor to fail, since, in the case of corresponding critical abrasion of the carbon brushes, current is no longer able to be conducted through the armature windings of the electric motor.

In particular, if an electrically commutated d.c. motor of this type is used in a brake system, for example as the pump motor, critical wear on or abrasion of the carbon brushes must be detected at an early stage. A variety of methods may be used to detect wear of this type in good time, for example in an electrohydraulic brake system, as described in German Patent Application No. DE 199 23 689. For example, it is possible to estimate the amount of wear on the carbon brush in a pump motor of the hydraulic portion of the brake system on the basis of the number of brakings during vehicle operation.

A further method and a device, respectively, for detecting the amount of wear on the drive system of an electric motor are known from the non-pre-published German Patent Application No. 10 2004 035318.

In this case, the abrasion of the carbon brushes of an electric motor is detected as wear using a wear variable. This wear variable is determined as a function of a speed variable representing the rotational speed of the electric motor. With the help of this speed variable, a measure of the number of revolutions completed by the electric motor is derived. Assuming a corresponding amount of wear, the abrasion of the carbon brushes is thereby detectable.

SUMMARY OF THE INVENTION

The present invention describes a method and a device, respectively, for detecting the amount of wear on the carbon brush drive system (drive circuit) of an electrically commutated d.c. motor, used for example in the form of a pump motor in a motor vehicle. The d.c. motor is driven by at least two carbon brushes and includes means for detecting the generative follow-up voltage. According to the present invention, the amount of wear on at least one carbon brush may be derived from the time behavior of the generative motor voltage and displayed to the driver.

The use of such a system for detecting the amount of wear on or abrasion of a carbon brush needed for operating the d.c. motor enables the timely detection of a motor failure, in particular if the motor is used as a pump motor in the brake system of a vehicle. The driver may thereby be alerted to an impending loss of pump power so that he may proceed to a repair shop in good time before a pump failure may become hazardous.

In a refinement of the present invention, the amount of wear on the carbon brushes is detected during motor startup. This has the advantage that the abrasion of the carbon brushes or the contact between the carbon brushes and the motor rotor has the greatest influence on the motor voltage during the startup phase.

An embodiment of the present invention enables the amount of wear on a single carbon brush to be selectively detected.

One of the carbon brushes used to drive the d.c. motor may be advantageously designed to be shorter than the other brushes. Although this limits the total operating time of the d.c. motor, due to the shortening, operation may nevertheless be maintained for a certain period of time (residual operating time) via the 3 still commutating brushes, depending on the degree of shortening of the one carbon brush. Due to such a shortening, the amount of wear at a preset abrasion may be detected by reducing the generative motor voltage.

Another way to selectively reduce the generative motor voltage upon reaching a preset abrasion and thereby to detect amount of wear is to inhibit one carbon brush via a corresponding limit stop in the brush holder. At a preset amount of wear on the carbon brush, this automatically interrupts or reduces the contact to the commutator and thus lowers the generative motor voltage. The inhibition may be produced, for example, by designing the carbon brush to have a specific contour. It is therefore conceivable to provide a recess (lug) which, however, is inserted only partially into the carbon brush. This may prevent the carbon brush from being pushed farther in the direction of the commutator following the preset abrasion.

In a particular embodiment of the present invention, amount of wear is detected while driving an electric motor on a pump motor in an antilock system, an electronic stability program or an electrohydraulic brake system of a vehicle.

The present invention enables the actual motor brush amount of wear to be detected more precisely so that the motors or carbon brushes do not have to be replaced prematurely. This has substantial economic advantages.

DETAILED DESCRIPTION

In the following exemplary embodiment, the application of the present invention is described on the basis of a pump motor used, for example, in an electrohydraulic brake system of a vehicle. However, the present invention may also be used in any type of commutated (d.c.) electric motor, even beyond the scope of automobiles, the drive system of which is subject to wear due to current transmission via carbon brushes.

Increased safety requirements with regard to availability and reliability are indispensable when using electric motors in hydraulic brake systems. As the operating time of or load on the systems increases, however, the fact that the motor meets the limits of its service life must be taken into account. When this limit is reached, the operation of the motor, and thus also the brake system, may fail unexpectedly, without the driver receiving prior warning. Via the detection of the amount of wear on the carbon brushes used to drive an electrically commutated d.c. motor, as described below, the motor failure is detectable in good time during vehicle operation and unnecessary road traffic hazards are avoided.

Figure 2:
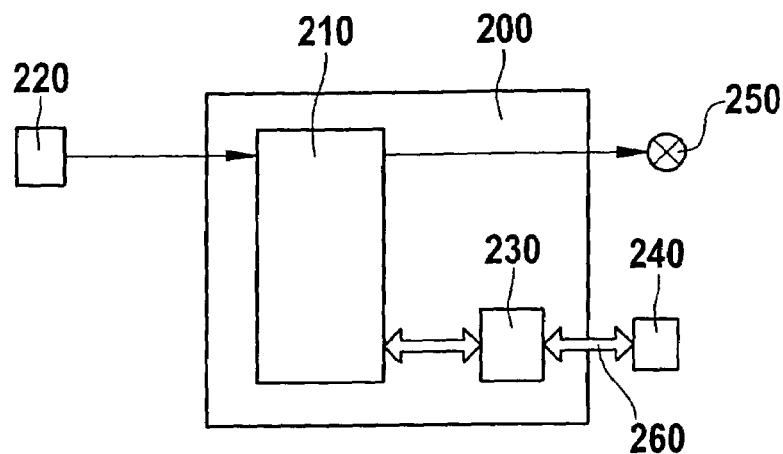
FIG. 2 shows a schematic representation of the system for detecting the generative motor voltage and displaying the amount of wear on the carbon brushes, based on a block diagram.

A device which detects the amount of wear on the carbon brushes of a d.c. motor and provides the driver with a corresponding warning is explained schematically on the basis of FIG. 2. For this purpose, a computer unit 210, which detects generative voltage $U_G$ of a (pump) motor 220, is provided in a control unit 200. In computer unit 210, this generative voltage $U_G$ is directly comparable with a voltage value $U_{New}$ which is to be expected in the case of new carbon brushes. Alternatively, however, the mean value of generative voltage $U_G$ may also be formed before this mean value is compared with a threshold value $SW_1$. Both voltage value $U_{New}$ and threshold value $SW_1$ may be stored in a memory 230 which is accessible by computer unit 210. Both values may also be stored or read externally 240, using a suitable interface 260, for example when replacing motor components during a visit to the repair shop. If corresponding wear is detected, the driver may be notified by an acoustic and/or optical signal 250. It is also possible to provide information regarding the amount of wear to a service technician during a visit to the repair shop via corresponding information in memory 230.

Figure 1A:
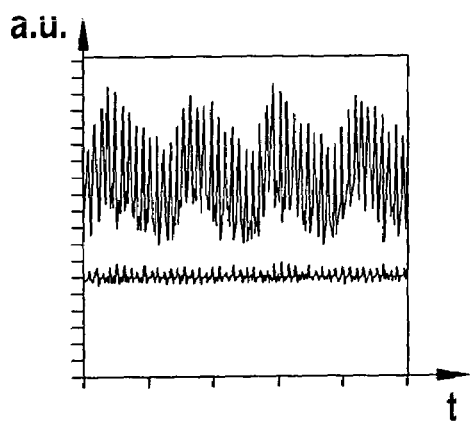
FIGS. 1a and 1b show two typical voltage characteristics which are detectable during driving on an electrically commutated d.c. motor.
Figure 1B:
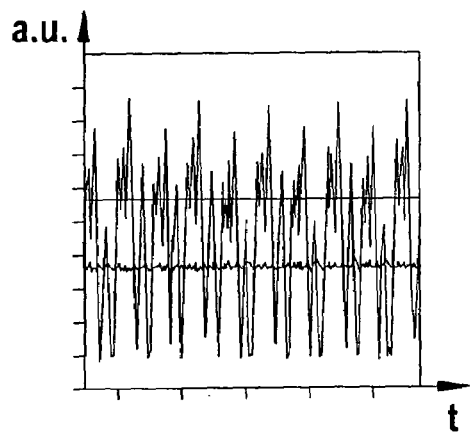
Figure 1C:
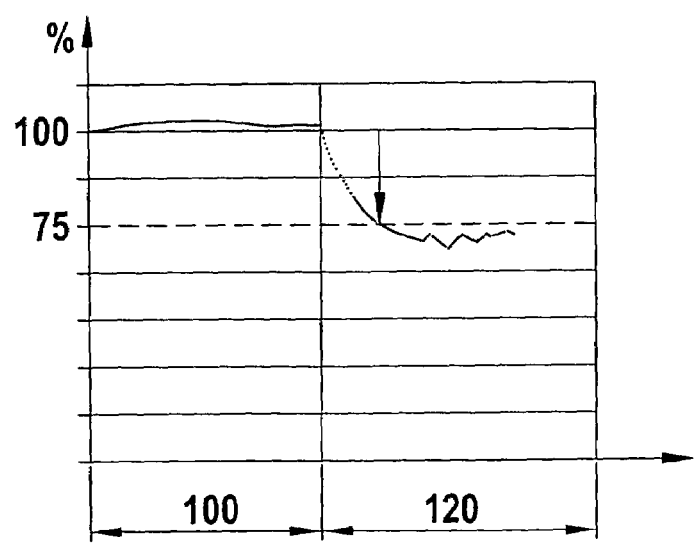
FIG. 1c shows the reduction of the motor voltage of the d.c. motor in the case of a substantially reduced contact between one carbon brush and the rotor of the d.c. motor.

FIG. 1a shows a typical voltage characteristic over time at the motor when using new carbon brushes. FIG. 1b, on the other hand, shows voltage dips resulting from the lifting action or from an insufficient contact between the carbon brushes and the motor. If one of the carbon brushes is abraded to the extent that there is no longer any contact at all with the motor, a voltage dip of approximately 30% occurs, as shown in FIG. 1c. While all 4 carbon brushes of a d.c. motor are operating in region 100, the motor is being operated by only 3 carbon brushes in region 120. Although motor operation may still be maintained, the power which the motor is able to generate is nevertheless limited. It is therefore highly advisable to replace the carbon brushes to avoid total failure.

Figure 3:
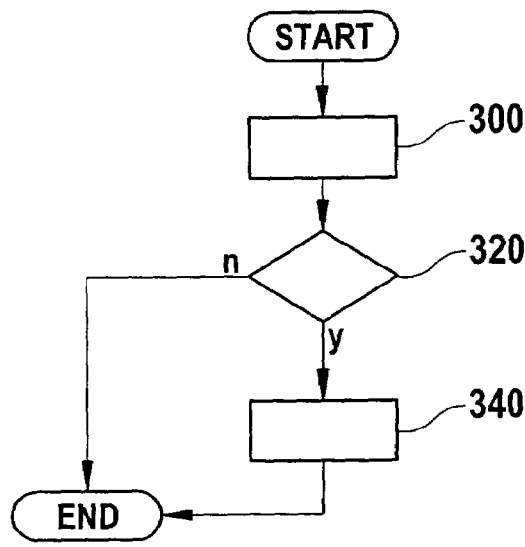
FIG. 3 shows a flow chart illustrating the detection of the amount of wear on at least one carbon brush via the mean value of the generative motor voltage.

The flow chart in FIG. 3 shows a first program which may run in computer unit 210. After the program starts, generative motor voltage $U_G$ is detected in a first step 300, and a mean value is derived from values for $U_G$ occurring in the past, for example via time weighting. A threshold value $SW_1$, which represents the mean value of the voltage when the carbon brushes are still fully functional, is read from memory 230. If the mean value exceeds threshold value $SW_1$, the program ends and is restarted during the next clock cycle, for example within the same generative cycle of the motor. However, if the mean value drops below threshold value $SW_1$, a certain wear or lifting of the carbon brushes is inferred. In step 340, the driver is subsequently notified by an acoustic and/or optical display 250 that the power supply to the pump has been impaired and a trip to the service station is advisable. At the same time, corresponding information may also be stored in memory 230 for retrieval during a visit to the repair shop. It is also conceivable to additionally store the mean values of generative motor voltage $U_G$ for checking during a visit to the repair shop. Upon detection of a mean value exceeding threshold value $SW_1$, which, however, differs substantially from the maximum possible mean value, the carbon brushes may be replaced at an early point in time.

Alternatively, the absolute value of the motor voltage may be used instead of the mean value of generative motor voltage $U_G$ to detect the amount of wear. As shown in step 400 of the flow chart in FIG. 4, the instantaneous value of generative motor voltage $U_G$ is likewise initially detected. Moreover, a comparison value $U_{New}$, which represents the maximum generative motor voltage in the case of newly installed and perfectly functioning carbon brushes, is read from memory 230. In subsequent step 420, detected generative motor voltage $U_G$ is compared with value $U_{New}$. If the difference according to $$U_{New} - U_G < SW_2$$

lies below a second preset threshold value $SW_2$, the program ends and is restarted in the next clock cycle, for example within the same generative cycle of the motor. However, if the difference exceeds threshold value $SW_2$, the amount of wear on the carbon brushes is detected, and the vehicle driver is notified in step 440 according to step 340. If the absolute value of the generative motor voltage is compared, it is also possible to store the currently detected values in the memory for service purposes later on.

Both programs illustrated may be started manually or automatically at presettable times. However, it is advantageous to start the programs after detection of generative operation, it being possible to carry out the program multiple times, in particular to form the mean value within a generative cycle.

Threshold values $SW_1$ and $SW_2$ may also be individually adapted to the motor characteristics or to the replaced carbon brushes and stored in memory 230. As mentioned above, it is also possible to store the values subsequently, for example, by a service technician during the course of replacement.

Figure 4:
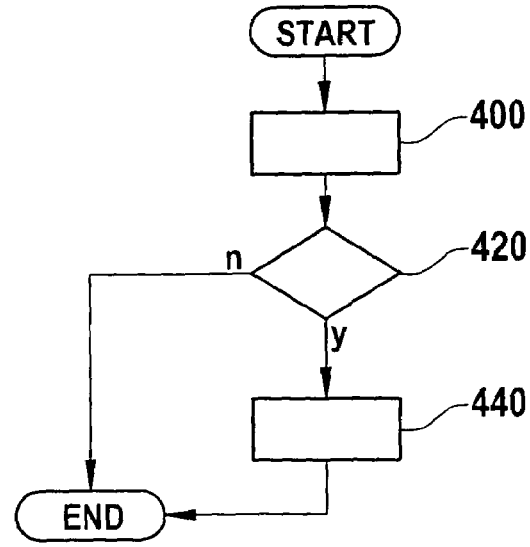
FIG. 4 shows the amount of wear via a comparison between the (absolute) motor voltage and a stored value.
Figure 5:
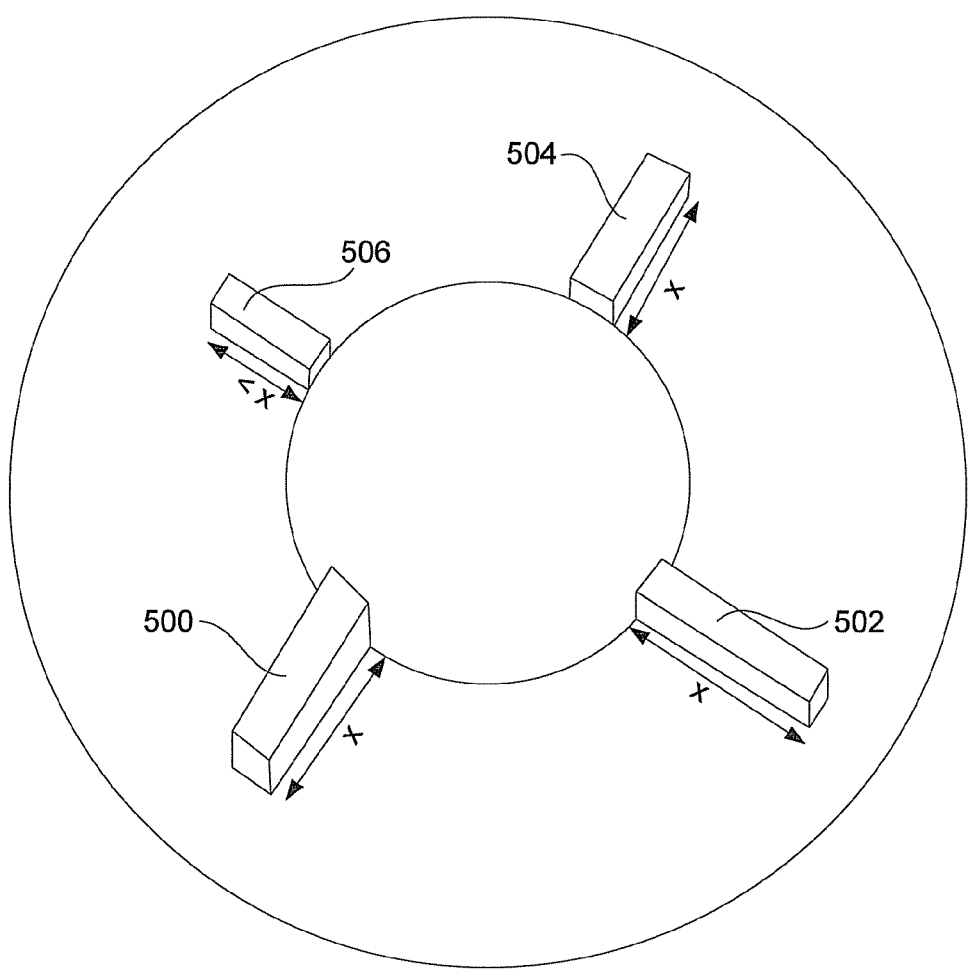
FIG. 5 shows an arrangement in which one carbon brush is shorter than other carbon brushes.

The programs according to FIGS. 3 and 4 may also be used to selectively determine the amount of wear on a single carbon brush. In a further exemplary embodiment, it is therefore conceivable to deliberately design one of the carbon brushes to be shorter for deliberate generation of a voltage dip following a preset amount of wear. For example, FIG. 5 (which is not drawn to scale) schematically shows four carbon brushes 500, 502, 504, and 506, where all of the brushes other than carbon brush 506 are indicated to have a length 'X.' Carbon brush 506 is indicated to have a length that is less than 'X.' In the program according to FIG. 4, for example, threshold value $SW_2$ may be set to a typical value of approximately 20% to 30% of the value Of $U_{New}$ to reliably detect a voltage dip of this type upon reaching the preset amount of wear (see, inter alia, FIG. 1c as well).

Figure 6:
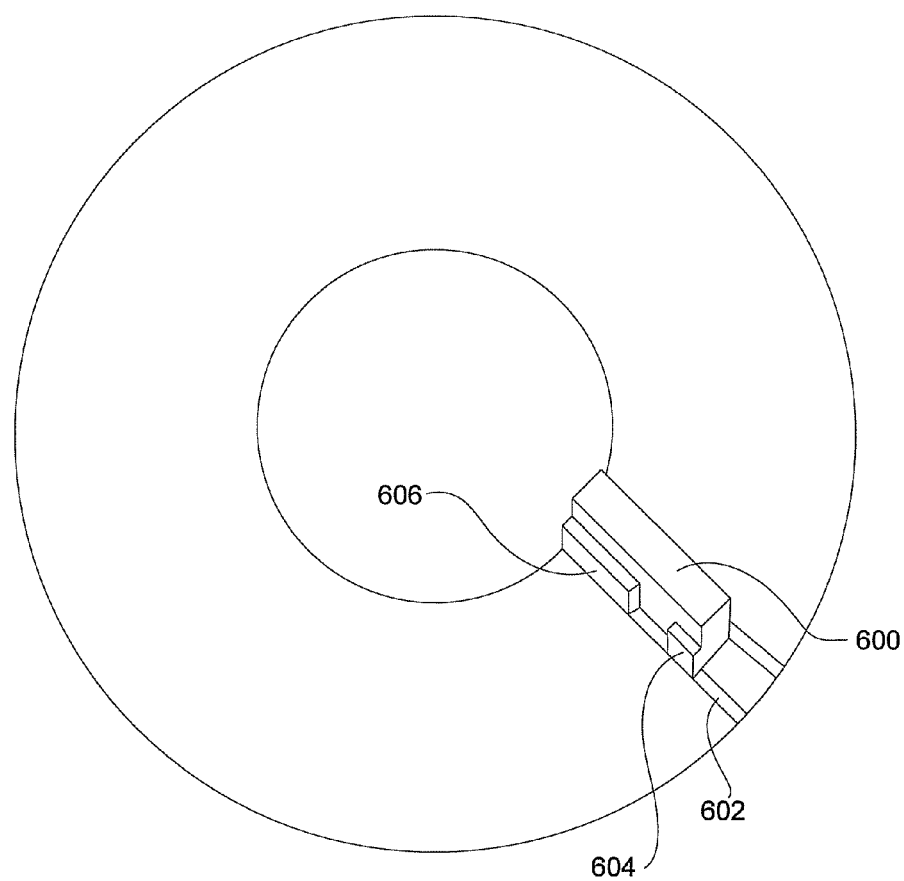
FIG. 6 shows an arrangement in which a carbon brush has a contour that can press against a limit stop of a holder.
Figure 7:
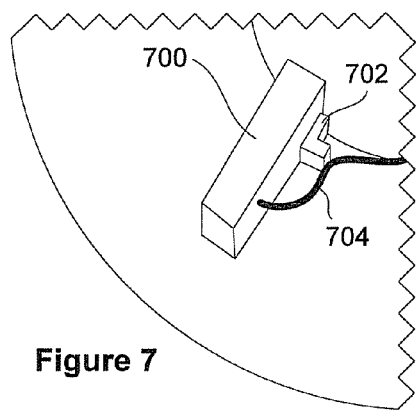
FIG. 7 shows an arrangement in which a carbon brush a stranded conductor can press against a limit stop of a holder.

Another way to selectively produce a voltage dip following a preset amount of wear is to provide the holder of the carbon brushes with a limit stop for a single brush. This likewise interrupts the contact between one carbon brush and the motor so that a voltage dip is detectable. In this alternative, it is conceivable, for example, to provide the carbon brush with a contour which enables the brush to move only a preset distance toward the motor before reaching a limit stop. For example, FIG. 6 schematically shows a carbon brush 600 in a holder 602 having a limit stop 606. The carbon brush 600 is shown to have a contour 604 that enables the carbon brush 600 to move only a preset distance toward the motor before reaching the limit stop 606. In addition, the stranded conductor representing the electrical connection with the carbon brush may be designed in such a way that, while the carbon brush in the holder is being pushed in the direction of the motor, the stranded conductor reaches a limit stop at a preset amount of wear on the carbon brush and thus inhibits the carbon brush. For example, FIG. 7 shows a carbon brush 700, where a stranded conductor 704 and a limit stop 702 of a holder are arranged such that, while the carbon brush 700 is pushed in the direction of the motor, the stranded conductor 704 reaches the limit stop 702 at a preset amount of wear on the carbon brush 700.

Generally speaking, generative motor voltage $U_G$ is intended to be measured at motor startup, during pulse-width-modulated operation and/or upon shutdown. A deterioration of the carbon brush contact due to wear and abrasion results in an inconstant commutation current or to a current chopping. The associated voltage dips indicate a lifting of the brushes. However, if the carbon brush contact is completely worn so that this carbon brush has no or very little contact with the motor, a state of wear is also ascertainable on the basis of the associated voltage dip.

Due to the reduced commutation when the carbon brushes are worn, the motor starting torque is reduced, which results in a reduced startup dynamic. The greatest influence of carbon brush wear is therefore observed during the motor startup phase, which is why the aforementioned detection of the amount of wear is preferably carried out at that point.

What is claimed is:

1. A method for detecting an amount of wear on a carbon brush drive system of an electrically commutated d.c. motor, the drive system having a plurality of carbon brushes, the method comprising:
   detecting an amount of wear on at least one of the carbon brushes as a function of a time behavior of a motor voltage;
   wherein the amount of wear is detected during a motor startup.

2. The method according to claim 1, wherein the motor is a pump motor in a motor vehicle.

3. A method for detecting an amount of wear on a carbon brush drive system of an electrically commutated d.c. motor, the drive system having a plurality of carbon brushes, the method comprising:
   detecting an amount of wear on at least one of the carbon brushes as a function of a time behavior of a motor voltage;
   wherein a single carbon brush is shorter than at least one other carbon brush for detecting the amount of wear on the carbon brushes.

4. The method according to claim 3, wherein the motor is a pump motor in a motor vehicle.

5. A method for detecting an amount of wear on a carbon brush drive system of an electrically commutated d.c. motor, the drive system having a plurality of carbon brushes, the method comprising:
   detecting an amount of wear on at least one of the carbon brushes as a function of a time behavior of a motor voltage;
   wherein one of the carbon brushes used for drive purposes is prevented from continuing operation at a preset amount of wear.

6. The method according to claim 5, wherein the motor is a pump motor in a motor vehicle.

7. A device for detecting an amount of wear on a drive system of an electrically commutated d.c. motor, the d.c. motor being driven with the aid of a plurality of carbon brushes, the device comprising:
   means for detecting a motor voltage; and
   an arrangement for detecting an amount of wear on at least one of the carbon brushes as a function of a time behavior of the motor voltage;
   wherein the amount of wear is detected during a motor startup.

8. The device according to claim 7, wherein the motor is a pump motor in a motor vehicle.

9. A device for detecting an amount of wear on a drive system of an electrically commutated d.c. motor, the d.c. motor being driven with the aid of a plurality of carbon brushes, the device comprising:
   means for detecting a motor voltage; and
   an arrangement for detecting an amount of wear on at least one of the carbon brushes as a function of a time behavior of the motor voltage;
   wherein a single carbon brush is shorter than at least one other carbon brush for detecting the amount of wear on the carbon brushes.

10. The method according to claim 9, wherein the motor is a pump motor in a motor vehicle.

11. A device for detecting an amount of wear on a drive system of an electrically commutated d.c. motor, the d.c. motor being driven with the aid of a plurality of carbon brushes, the device comprising:
    means for detecting a motor voltage;
    an arrangement for detecting an amount of wear on at least one of the carbon brushes as a function of a time behavior of the motor voltage; and
    a holder for the carbon brushes, wherein the holder of a single carbon brush is designed in such a way that an operation of the carbon brush is hindered at a preset amount of wear on the carbon brush.

12. The device according to claim 11, wherein the carbon brush has a contour which presses the carbon brush against a limit stop of the holder at the preset amount of wear.

13. The method according to claim 12, wherein the motor is a pump motor in a motor vehicle.

14. The device according to claim 11, wherein a stranded conductor which produces an electrical contact to the carbon brush presses against a limit stop of the holder at the preset amount of wear.

15. The method according to claim 14, wherein the motor is a pump motor in a motor vehicle.

16. The method according to claim 11, wherein the motor is a pump motor in a motor vehicle.

* * * * *